United States Patent
Roche et al.

(10) Patent No.: US 7,321,506 B2
(45) Date of Patent: *Jan. 22, 2008

(54) MULTIVIBRATOR PROTECTED AGAINST CURRENT OR VOLTAGE SPIKES

(75) Inventors: Philippe Roche, Le Versoud (FR); Francois Jacquet, Froges (FR); Sylvain Clerc, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/379,720

(22) Filed: Apr. 21, 2006

(65) Prior Publication Data

US 2006/0255870 A1    Nov. 16, 2006

(30) Foreign Application Priority Data

Apr. 22, 2005    (FR) .................................. 05 04034

(51) Int. Cl.
*G11C 11/41* (2006.01)
(52) U.S. Cl. .................. 365/154; 365/189.05; 365/226
(58) Field of Classification Search ............ 365/185.08
See application file for complete search history.

(56) References Cited

U.S. PATENT DOCUMENTS

| | | | | |
|---|---|---|---|---|
| 3,812,384 A | * | 5/1974 | Skorup ....................... | 365/154 |
| 4,495,628 A | * | 1/1985 | Zasio .......................... | 377/70 |
| 4,820,939 A | * | 4/1989 | Sowell et al. ................ | 327/141 |
| 4,843,254 A | * | 6/1989 | Motegi et al. ............... | 327/203 |
| 5,107,137 A | * | 4/1992 | Kinugasa et al. ........... | 327/203 |
| 5,471,152 A | * | 11/1995 | Gheewala et al. ........... | 324/758 |
| 6,389,566 B1 | * | 5/2002 | Wagner et al. .............. | 714/726 |
| 6,711,089 B2 | * | 3/2004 | Ong ........................... | 365/233 |
| 7,196,959 B2 | * | 3/2007 | Jacquet et al. .............. | 365/226 |
| 2007/0002619 A1 | * | 1/2007 | Schoenauer et al. ... | 365/185.08 |

OTHER PUBLICATIONS

Myjak et al., "Enhanced Fault-Tolerant CMOS Memory Elements", The 2004 47th Midwest Symposium on Circuits and Systems, Hiroshima, Japan, Jul. 25-28, 2004, vol. 1, pp. 1453-1456, ISBN: 0-7803-8346-X.

Hazucha et al., "Measurements and Analysis of SER-Tolerant Latch in a 90-nm Dual-$V_T$ CMOS Process", IEEE Journal of Solid-State Circuits, vol. 39, No. 9, Sep. 2004, pp. 1536-1543, ISSN: 0018-9200.

* cited by examiner

*Primary Examiner*—Tan T. Nguyen
(74) *Attorney, Agent, or Firm*—Lisa K. Jorgenson; Allen, Dyer, Doppelt, Milbrath & Gilchrist, P.A.

(57) ABSTRACT

The multivibrator is protected against current or voltage spikes and includes a first data transfer port that receives, as input, multivibrator input data, and a first/master latch cell connected on the output side of the first transfer port. A second/slave latch cell is included, and a second data transfer port is placed between the first and second latch cells. Each latch cell includes a set of redundant data storage nodes. The transfer ports each circuits/devices for writing data separately into each storage node.

28 Claims, 10 Drawing Sheets

MULTIVIBRATOR PROTECTED AGAINST CURRENT OR VOLTAGE SPIKES

FIELD OF THE INVENTION

The present invention relates to multivibrators protected against current or voltage spikes, particularly multivibrators of the flip-flop type. However, the invention applies in general to any type of multivibrator protected against such current or voltage spikes.

BACKGROUND OF THE INVENTION

The progressive and continuous miniaturization of electronic circuits makes it possible to obtain circuits that continue to increase in performance while continuing to decrease in size. On the down side, such circuits are increasingly sensitive to their external environment, and in particular to logic upsets due to an influx of energy coming from outside the circuit. A logic upset is a point state change or a transient state, resulting from a voltage spike and/or a current spike at a point in an integrated circuit. By definition, an upset is not predictable or is very unlikely to be predicted.

Logic upsets may have different origins. A logic upset is, for example, induced by the impact of an energetic charged particle at a point in an integrated circuit. Such an upset is known as a single event upset or SEU. This type of upset appears in integrated circuits used for space applications, because of the radiation encountered beyond the atmospheric and magnetospheric layers that protect the earth. This type of upset is also becoming more frequent in integrated circuits for terrestrial applications, especially in the smallest technologies, such as 0.25 micron, 0.18 micron, 0.12 micron and even finer technologies. A logic upset may also be induced by capacitive coupling at discrete points between two layers of the same integrated circuit. Such an upset is in this case often referred to as a "glitch".

An upset, whatever its origin, is generally manifested by a voltage and/or current spike on a digital or analog signal at a disturbed point in a circuit, formed by the point of impact of the energetic particle in the case of an SEU upset. If the equivalent capacitance of the circuit downstream of the disturbed point is denoted by C, the change in voltage $\Delta V$ at the disturbed point in question can be written as $\Delta V = \Delta Q/C$, $\Delta Q$ being the change in charge resulting from the impact. The change in voltage $\Delta V$ generally has a very short duration, for example very much less than the period of a clock signal driving the circuit.

An upset may have relatively serious consequences on the downstream circuit that it disturbs. For example, for a downstream circuit using only logic signals, if the change in voltage $\Delta V$ is low enough not to cause a change in state, the disturbance disappears in quite a short time, with no consequence for the downstream circuit. This is especially the case when the equivalent downstream capacitance is high or when the change in charge $\Delta Q$ is small. In contrast, if the change in voltage $\Delta V$ is higher, and especially if it is high enough to modify the value of a logic signal, then the consequences may be substantial.

In particular, a change in voltage $\Delta V$ generated by an upset may disturb the normal operation of a flip-flop multivibrator. Specifically, such a multivibrator generally includes two latch cells, called the master cell and the slave cell, each connected to the output of a transfer port. When an active edge of a clock signal is received by the multivibrator, input data is firstly stored in the master latch cell. The data is transmitted to the second, slave, latch cell and into the output of the multivibrator when an active edge of the clock signal is applied to the second data transfer port. Thus, when the multivibrator receives an active edge of the clock pulse, it reproduces, over the period of the clock signal, on its output, the signal that it receives on its data input.

Now, an upset of substantial amplitude may cause the logic levels present on the input of each latch cell to switch when they are not imposed by a corresponding transfer port. Such switching, that is to say the modification of the content of the latch cells, will, of course, have the consequence of introducing an error into the outputs from the multivibrator.

For the purpose of protecting the multivibrators against upsets and thus preventing any disturbance of the downstream circuit, it has been proposed to produce each latch cell in a redundant manner, that is to say in the form of a set of redundant data storage nodes, so that when an upset causes an alteration in the logic level stored in one of the nodes, the initial information may be restored from the information stored in a complementary node.

SUMMARY OF THE INVENTION

With regard to the foregoing, an object of the invention is to further improve the protection of multivibrators against current or voltage spikes.

The invention is directed to a multivibrator protected against current or voltage spikes, comprising a first data transfer port that receives, as input, multivibrator input data, a first, master, latch cell connected on the output side of the first transfer port, a second, slave, latch cell, and a second data transfer port placed between the first and second latch cells, each latch cell comprising a set of redundant data storage nodes. According to the invention, the transfer ports each comprise a device or means for writing data separately into each storage node.

An erroneous item of information is thus prevented from being written simultaneously to the set of storage nodes in the case where an upset occurs immediately at the input of a latch cell.

In one embodiment, each latch cell comprises four storage nodes, the transfer ports each comprising four separate write circuits for writing respectively the data into the four nodes. In this case, for example, each write circuit comprises a first MOS transistor of N type whose gate is intended to receive a data item emanating from a data storage node of the first latch cell and whose drain is linked to the source of a second MOS transistor of N type whose gate receives a clock signal and whose drain is used to write the data into a storage node of the second latch cell.

This multivibrator can furthermore comprise an input circuit suitable for formulating redundant data for the first latch cell. This further improves the protection of the multivibrator against upsets. For example, this input circuit comprises an inverter circuit for the inversion of an input data item, whose output is intended to be written to data storage nodes.

According to another characteristic of the invention, the multivibrator furthermore comprises an output circuit protected against current or voltage spikes and disposed at the output of the second data storage cell. For example, this output circuit comprises two stages, one providing for the transfer of the data in the high state and the other for the transfer of the data in the low state.

In another embodiment, the stage providing for the transfer of the data in the low state comprises a first MOS transistor of P type whose gate receives a data item in the low state and whose source is linked to a DC power supply, and a second MOS transistor of P type whose source is linked to the drain of the first MOS transistor, whose gate receives a data item in the low state and whose drain provides a data item at the output of the multivibrator.

As far as the stage providing for the transfer of the data in the high state is concerned, the latter comprises a first MOS transistor of N type whose gate receives a data item in the high state, and whose drain is linked to the drain of the second MOS transistor of P type and provides a data item at the output of the multivibrator, and a second MOS transistor of N type whose drain is linked to the source of the first MOS transistor of N type and whose gate receives a data item in the high state and whose source is connected to ground.

In one embodiment, the multivibrator comprises a second output circuit protected against current and voltage spikes disposed at the output of the second data storage cell and suitable for providing an output data item of the multivibrator inverted. In this case, according to an exemplary implementation of the multivibrator, the second output circuit comprises a stage providing for the transfer of the data in the low state, which comprises a first MOS transistor of P type whose source is linked to a DC power supply source and a second MOS transistor of P type whose source is linked to the drain of the first MOS transistor and whose drain provides the inverted output data item of the multivibrator, the gate of the first and second MOS transistors of P type of the second output circuit receiving redundant data constituting the inverse of the data presented on the gate of the first and second MOS transistors of P type of the first output circuit.

Furthermore, the second output circuit comprises a stage providing for the transfer of the data in the high state comprising a first transistor of N type whose drain is linked to the drain of the second transistor of P type of the second output circuit and provides an inverted output data item of the multivibrator and a second transistor of N type whose drain is linked to the source of the first transistor of N type and whose source is connected to earth, the gate of the first and second transistors of N type of the second output circuit receiving redundant data constituting the inverse of the data presented on the gate of the first and second transistors of N type of the first output circuit.

According to yet another embodiment, the multivibrator furthermore comprises, combined or otherwise with the duplication output stage, asynchronous means of initialization and of resetting to an initial state of the data storage nodes. For example, such means of initialization and of resetting to the initial state may comprise a set of MOS transistors whose gate receives an initialization control signal and/or a reset to the initial state control signal and whose source and drain are linked, the one to a predetermined potential and the other to a corresponding data storage node so as to force the node to the potential under the supervision of the said control signal.

In an embodiment of the means of initialization and of resetting to the initial state, the latter further comprises a set of MOS transistors placed in series with transistors associated with the said data storage nodes in such a way as to inhibit the influence of these transistors when the initialization and/or reset to the initial state command is active.

The multivibrator furthermore comprises a clock circuit for delivering a clock signal to the multivibrator, the clock circuit comprising a supervision stage delivering a supervision signal suitable for disabling the clock signal as long as the means of initialization and of resetting to the initial state are active. According to a mode of implementation, the clock circuit comprises a first port providing for a NAND function between the initialization control signal and the reset to the initial state control signal and at least one port providing for a NOR function between the output of the first port and the clock signal.

The multivibrator may additionally comprise a multiplexing circuit suitable for writing selectively to the multivibrator a first input data item of the multivibrator or a second input data item of the multivibrator, the second data item being preferably a data item for testing the multivibrator emanating from a logic and exterior circuit. According to an implementation of the multiplexing circuit, the latter comprises a first input circuit receiving the input data item of the multivibrator and a second input circuit receiving the test data item, each input circuit comprising a MOS transistor of N type and a MOS transistor of P type for transferring the said data in the high state and in the low state, respectively, under the supervision of two access transistors driven by test control signals.

For example, the first input circuit comprises a first MOS transistor of P type and a second MOS transistor of N type, whose gate receives the input data item, the drain of the first transistor of P type being linked to the drain of the second transistor of N type, a first access transistor of P type whose source is linked to a DC supply voltage, whose drain is linked to the source of the first transistor of P type and whose gate receives a test control signal and a second access transistor of N type whose source is connected to earth, whose drain is connected to the source of the second transistor of N type and whose gate receives a second test control signal constituting the inverse of the first control signal.

As far as the second input circuit is concerned, the latter comprises a first MOS transistor of P type and a second MOS transistor of N type, whose gate receives the test data, the source of the first transistor of P type being connected to a DC supply voltage and the source of the second transistor of N type being connected to ground, a first access transistor of P type whose source is connected to the drain of the first transistor of P type and whose gate receives the second test control signal, and a second access transistor of N type whose source is connected to the drain of the second transistor of N type and whose gate receives the first test control signal, the drain of the first and second access transistors being linked to the input of the multivibrator.

According to yet another aspect, the invention also relates to a set of multivibrators comprising a chain of multivibrators as defined above disposed in series, wherein a multiplexing circuit is interposed between two consecutive multivibrators so as to write selectively to the multivibrator either a write data item during normal operation of the multivibrators, or a test word for the multivibrator during a test phase.

BRIEF DESCRIPTION OF THE DRAWINGS

Other objects, features and advantages of the invention will become apparent on reading the following description, given solely by way of non-limiting example, and with reference to the appended drawings in which.

DETAILED DESCRIPTION OF THE PREFERRED EMBODIMENTS

Figure 1:
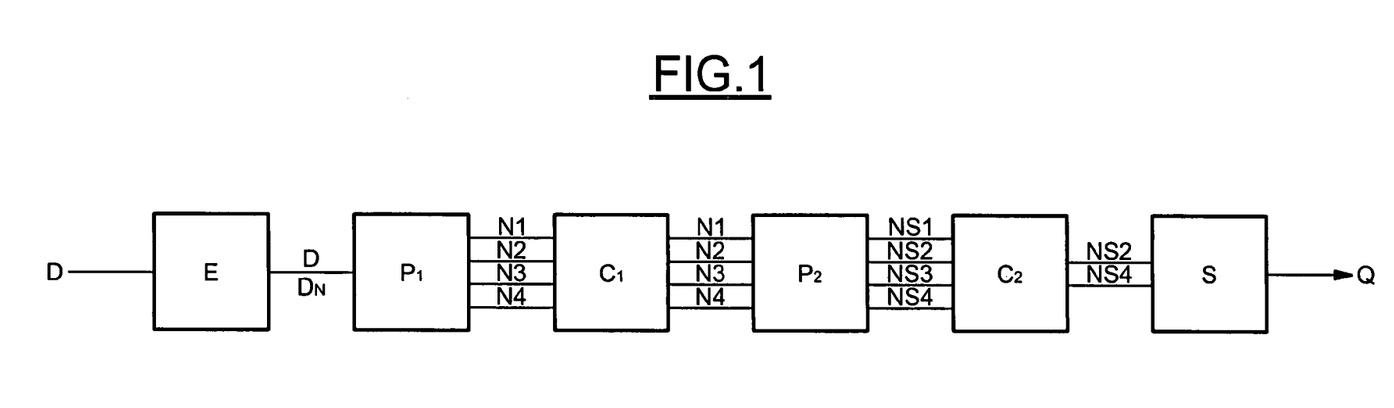
FIG. 1 is a schematic diagram illustrating the structure of a flip-flop multivibrator according to the invention.

FIG. 1 shows the overall architecture of an example of an electronic diagram of a multivibrator of the flip-flop type protected against current or voltage spikes. As may be seen in this figure, such a multivibrator comprises: a first data transfer port $P_1$ receiving, as input, data D and DN coming from an input circuit E; a first, master, data latch cell $C_1$, used for temporarily storing the data coming from the transfer point $P_1$; a second data latch cell $C_2$, constituting a slave latch cell, into which the data coming from the first, master cell $C_1$ is transferred; a second data transfer port $P_2$; and an output circuit S.

Figure 2:
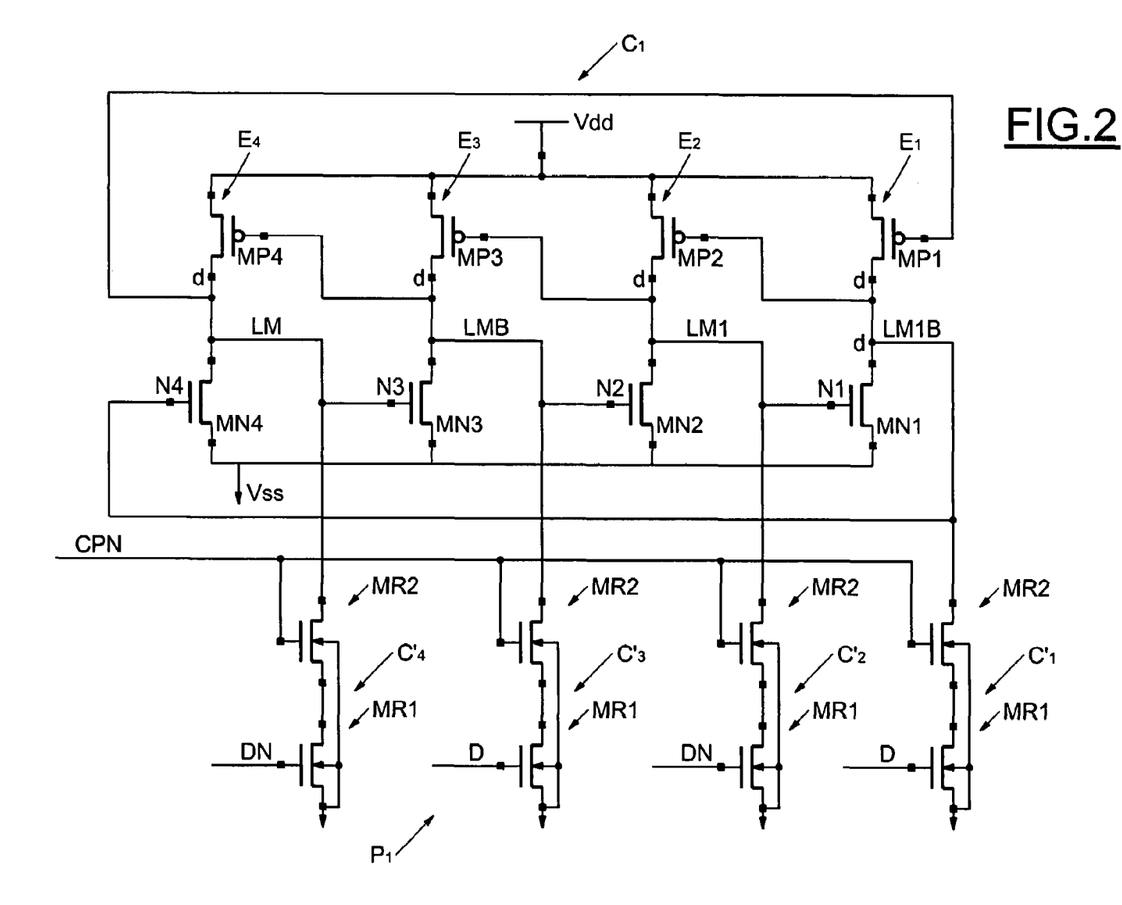
FIG. 2 is a schematic diagram illustrating the structure of the first latch cell and the corresponding transfer port of the flip-flop multivibrator of FIG. 1.
Figure 3:
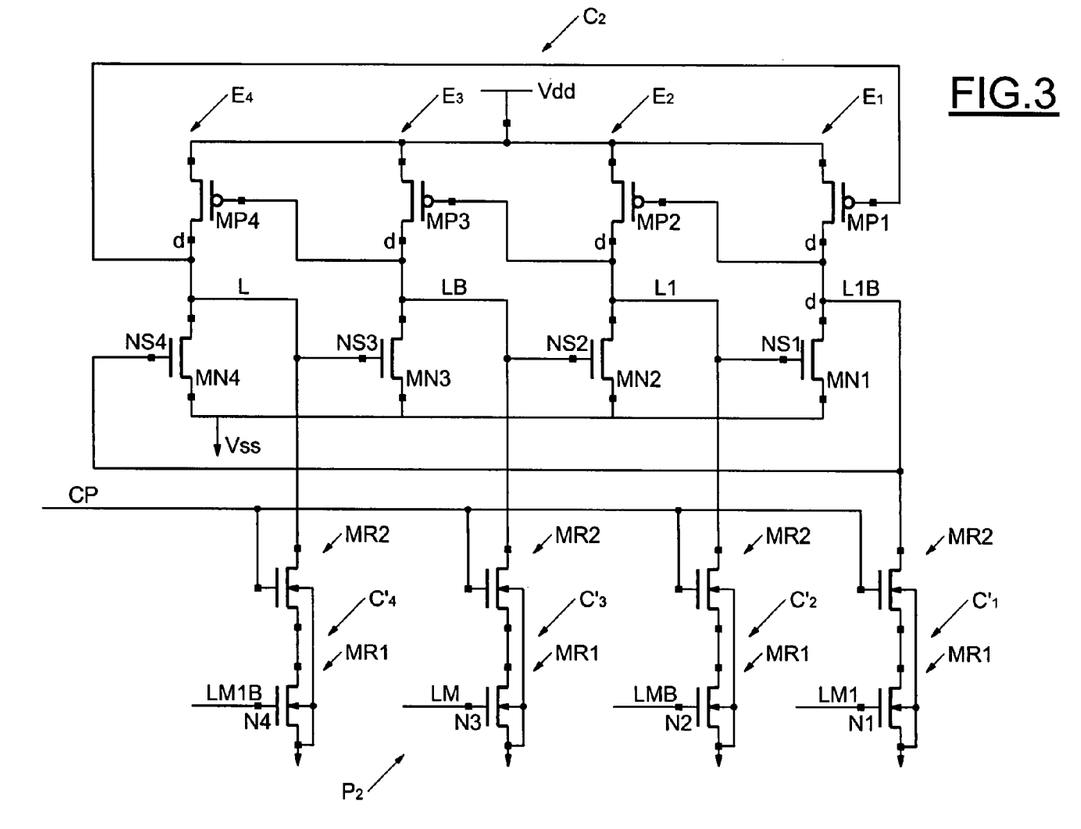
FIG. 3 is a schematic diagram illustrating the structure of the second latch cell and the corresponding transfer port in the flip-flop multivibrator of FIG. 1.

As may be seen in FIGS. 2 and 3, the master data latch cell comprises four sets of transistors $E_1$, $E_2$, $E_3$ and $E_4$ used for controlling the voltage level of four respective data storage nodes N1, N2, N3 and N4. Likewise, the slave data latch cell comprises four sets of transistors $E_1$, $E_2$, $E_3$ and $E_4$ used for controlling the voltage level of four respective data storage nodes NS1, NS2, NS3 and NS4. Each set of transistors comprises a p-type MOS transistor and an n-type MOS transistor. Thus, each latch cell $C_1$ or $C_2$ comprises four p-type MOS transistors, namely MP1, MP2, MP3 and MP4, and four n-type MOS transistors, namely MN1, MN2, MN3 and MN4.

The source of each of the transistors MP1, MP2, MP3 and MP4 is connected to a DC voltage source Vdd, for example equal to 1.2 volts, and the source of the transistors MN1, MN2, MN3 and MN4 is connected to an earthing circuit Vss. The drain d of each p-type MOS transistor of a set i of transistors $E_i$ (i=1, 2, 3, 4) is connected to the drain of the corresponding MNi-type MOS transistor. Regarding the sets of transistors $E_1$, $E_2$, $E_3$ and $E_4$ of the master cell, the node between the p-type transistors and the n-type transistors, called N4, N1, N2 and N3 respectively, are connected to the gate of the p-type MOS transistors of the sets $E_2$, $E_3$, $E_4$ and $E_1$ and to the gates of the n-type MOS transistors of the sets $E_4$, $E_1$, $E_2$ and $E_3$, respectively.

The slave cell is designed in an identical manner. The nodes between the p-type transistors and the n-type transistors of the sets of transistors $E_1$, $E_2$, $E_3$ and $E_4$, denoted by NS4, NS1, NS2 and NS3 respectively, are connected to the gates of the p-type MOS transistors MP2, MP3, MP4 and MP1 and to the gates of the n-type MOS transistors MN4, MN1, MN2 and MN3, respectively. The nodes N1, N2, N3 and N4, on the one hand, and NS1, NS2, NS3 and NS4, on the other, used for storing logic information, constitute redundant storage nodes and are connected to the gate of the n-type MOS transistors MN1, MN2, MN3 and MN4, respectively.

As may be seen in FIGS. 2 and 3, access to the nodes N1, N2, N3, N4 and NS1, NS2, NS3, NS4 of the master and slave latch cells takes place via the data transfer ports $P_1$ and $P_2$, which comprise four access circuits that correspond to four write circuits for four sets of data coming from the input circuit E and from the first latch cell, respectively. Preferably, in the master cell, data D is written into the nodes N1 and N3 and the complement DN of this data is written into the nodes N2 and N4. The data coming from the nodes N4 (or LM1B), N1 (or LM1), N2 (or LMB) and N3 (or LM), in the nodes NS4, NS1, NS2 and NSS respectively, are written into the slave cell. The transfer ports $P_1$ and $P_2$ are thus each formed from a combination of four write circuits $C'_1$, $C'_2$, $C'_3$ and $C'_4$.

Each write circuit comprises a first n-type MOS transistor MR1 and a second n-type MOS transistor MR2. The gate of each transistor MR1 receives data D or DN to be written, or data coming from a node of the master cell, and the source of this transistor MR1 is connected to earth. The gate of the second transistor MR2 receives a clock signal CPN or CP delivered by an appropriate circuit and the source of each transistor MR2 is connected to the drain of a corresponding transistor MR1. Finally, the drain of each transistor MR2 is connected to a corresponding data storage node. Regarding the second data transfer port $P_2$, the transistors MR2 are controlled by a complementary clock signal CP of the clock signal CPN controlling the first port $P_1$.

Figure 4:
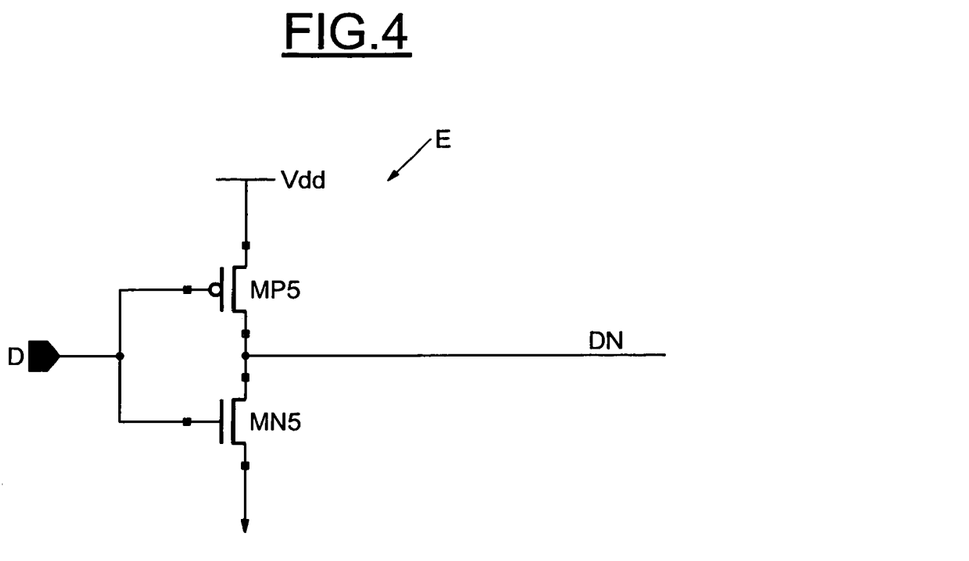
FIG. 4 is a schematic diagram illustrating the input circuit in the flip-flop multivibrator of FIG. 1.

As shown in FIG. 4, the input circuit E is intended to generate redundant data for the first data transfer port $P_1$. It comprises an inverter circuit that delivers inverted data DN. The inverter circuit comprises a p-type MOS transistor MP5, the source of which is connected to a DC supply voltage Vdd and an n-type MOS transistor MN5, the drain of which is connected to the drain of the transistor MP5 and the source of which is connected to earth. The gates of the two transistors MP5 and MN5 are connected and receive, as input, data D, whereas the common drain between the transistors MP5 and MN5 delivers the inverted input data DN.

Figure 5:
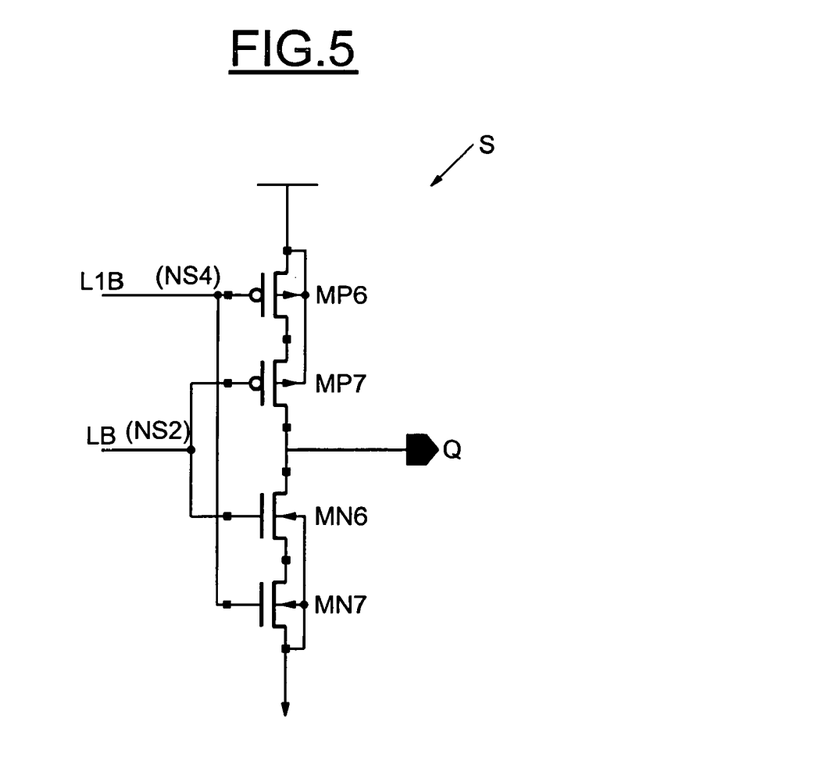
FIG. 5 is a schematic diagram illustrating the output circuit in the flip-flop multivibrator of FIG. 1.

Finally, the output circuit S illustrated in FIG. 5 constitutes an output stage protected against current or voltage spikes and receives data coming from the nodes of the second latch cell. This output circuit S comprises two stages, one for transferring data in the high state and the other for transferring data in the low state. The stage for transferring data in the low state comprises a first p-type MOS transistor MP6 and a second p-type MOS transistor MP7. The source of the first transistor MP6 is connected to a supply voltage and the drain of this transistor is connected to the source of the transistor MP7. The gate of the transistor MP6 receives data L1B (or NS4) in the low state. The gate of the transistor MP7 also receives data LB (or NS2) in the low state.

Regarding the stage for transferring data in the high state, this stage comprises a first n-type MOS transistor MN6 and a second n-type MOS transistor MN7. The drain of the transistor MN6 is connected to the drain of the transistor MP7, whereas the source of this transistor MN6 is connected to the drain of the transistor MN7, the source of which is connected to earth. The gate of the transistor MN6 receives the input data in the high state. The gate of the transistor MN7 likewise receives data in the high state. The common node between the drain of the transistor MP7 and the drain of the transistor MN6 delivers the output Q of the multivibrator.

The circuit as described with reference to FIGS. 1 to 5 operates as follows. When an active edge of the clock signal CPN arrives, that is to say when the clock signal CPN switches to the high level, the first port $P_1$ is conducting and the first, master latch cell $C_1$ is active. In contrast, when the signal CP switches to the low level, the second port $P_2$ is blocked and the second latch cell $C_2$ is inactive. The data presented at the input of the first transfer port $P_1$ is transferred to the first, master latch cell $C_1$, the transistors MR2 of this port $P_1$ being in the on state. The logic level stored in the nodes N1, N2, N3 and N4 then depends on the logic level of the incident data D and DN.

As soon as an active (rising) edge appears on the clock signal CP, that is to say when the signal CPN switches to the low level, the port $P_1$ is blocked and the port $P_2$ becomes conducting. The data coming from the storage nodes of the first, master cell is then transferred to the corresponding nodes of the second, slave cell $C_2$, to be available on the output Q of the multivibrator, as long as the signal CP remains at the high level, whereas the first latch cell $C_1$ is isolated.

As will be explained below, the arrangement that has just been described provides effective protection against current and/or voltage upsets. Firstly, the information in the latch cells is stored in a redundant manner in pairs of complementary nodes. Thus, any degradation of the information stored in one node of one of the pairs may be restored from the information stored in the other node.

For example, the "1", "0", "1" and "0" data is stored in the nodes N1, N2, N3 and N4, respectively. If a disturbance appears on the node N1, as a result of a transient spike of negative voltage, the corresponding drop in voltage on the gate of the transistor MN1 causes this transistor to be turned off. In contrast, this disturbance causes the p-type MOS transistor MP3 to conduct. However, the voltage of the node N2 is maintained at 0 by the transistor MN3. The transistor MP4 is therefore kept in the on state, so that the transistor MP1 remains in the off state and the voltage on the node N4 is not altered. Likewise, the logic level stored in the node N3 is not modified. At the same time, the logic level of the node N1 is restored via the transistor MP2.

The arrangement that has just been described allows a logic level stored in a node to be restored after a disturbance generated by an upset. Furthermore, by using transfer ports provided with specific access circuits used for writing data into the respective nodes N1, N2, N3 and N4, a disturbance is prevented from being simultaneously transmitted to all of the nodes. Thus, for example, if only one of the nodes is corrupted in the master latch cell, only one of the corresponding nodes will be temporarily disturbed. However, it may be restored to its initial state, as described above. Furthermore, by using the output circuit which comprises two stages for transferring the data in the high state and in the low state, respectively, when one of the inputs of this stage is temporarily modified, the output becomes a high impedance output and is therefore capacitively maintained at its initial value, so that the output is not disturbed.

Figure 6:
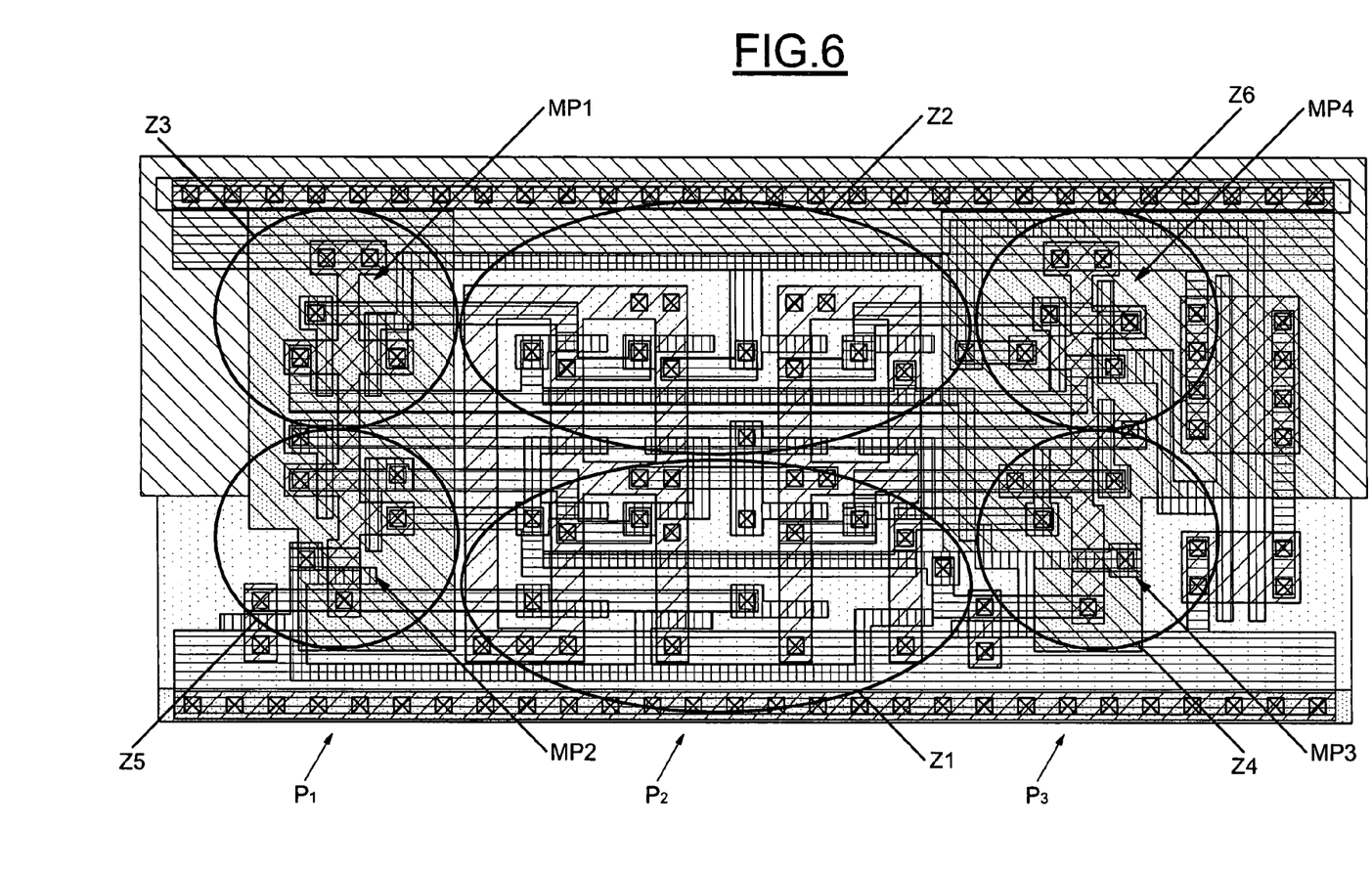
FIG. 6 is a schematic diagram illustrating an exemplary implementation of the multivibrator of FIG. 1, in accordance with the invention.

To further improve the protection of the multivibrator against upsets, and in particular to prevent an upset from being able simultaneously to alter two complementary nodes in which the same information is stored in a redundant manner, the nodes of each pair opposite each other are implanted in a region of a substrate defining the multivibrator. FIG. 6 shows the layers of a material deposited on a semiconductor substrate for producing the various elements of the circuit of FIG. 1. The technique for producing these elements lies within the scope of a person skilled in the art and will therefore not be described in detail below.

However, it should be noted that the various transistors used for producing the multivibrator are formed in three isolated wells, namely an n-type first well $P_1$, a p-type second well or $P_{well}$ and an n-type third well $P_3$ or $N_{well}$. The nMOS transistors MN1, MN2, MN3 and MN4 of the master latch cell are placed in a first zone Z1 of the p-type central well $P_2$, while the nMOS transistors MN1, MN2, MN3 and MN4 of the slave cell $C_2$ are placed in a second zone Z2 of the central well $P_2$. In contrast, the pMOS transistors MP1, MP2, MP3 and MP4 of each master or slave cell are distributed over the two n-type wells $P_1$ and $P_3$ in such a way that the two data storage nodes of each pair are placed opposite each other, that is to say on either side of the central well $P_2$.

For example, the transistor MP1 is implanted in a first zone Z3 of the first well $P_1$ and the transistor MP3 in a zone Z4 of the third well $P_3$ placed opposite the first zone Z3. Likewise, the transistor MP2 is implanted in a second zone Z5 of the first well $P_1$ placed in the vicinity of the first zone Z3 and the transistor MP4 in a second zone Z6 of the third well $P_3$ extending near the first zone Z4. Thus, thanks to this arrangement, the node N1 is as far away as possible from the node N3, and the node N2 is also as far away as possible from the node N4.

For example, these transistors are at a distance of at least 1 micron apart, so as to prevent an ionized particle, the diameter of which is typically around 0.6 microns, which has disturbed one of these transistors, from disturbing the other transistor, even though shorter distances could also be envisaged. Thus, an ionized particle is prevented from simultaneously disturbing the nodes N1 and N3, on the one hand, and the nodes N2 and N4 on the other. Furthermore, by producing the transistors MP1, MP2, MP3 and MP4 in two n-type wells separated by a p-type well in which the n-type transistors are implanted, each pair of redundant data storage nodes is isolated thanks to the formation of a junction between the wells.

Figure 11:
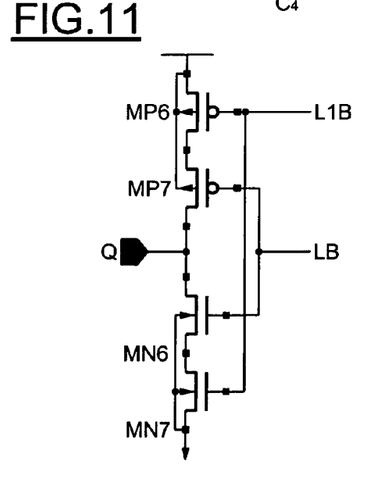
FIG. 11 is a schematic diagram illustrating a first output circuit for the second latch cell of FIG. 8.
Figure 12:
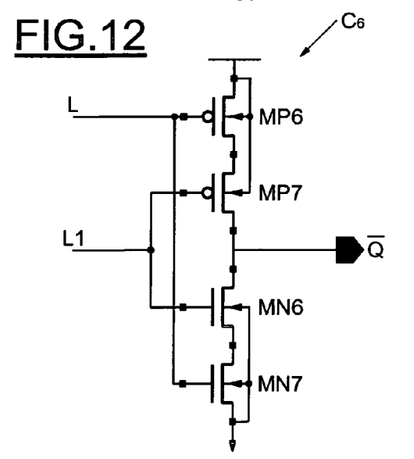
FIG. 12 is a schematic diagram illustrating a second output circuit for the second latch cell of FIG. 8.

Another exemplary embodiment of a multivibrator of flip-flop type protected against current or voltage spikes will now be described with reference to FIGS. 7 to 13. In these figures, for the sake of clarity, elements identical to those of FIGS. 1 to 6 are designated by the same reference signs. As in the exemplary embodiment described previously with reference to FIGS. 2 to 4, according to this embodiment, the flip-flop multivibrator also comprises a first, master, latch cell $C_1$ associated with a first transfer port $P_1$ (FIG. 7), a second, slave, latch cell $C_2$ associated with a second transfer port $P_2$ (FIG. 8) and an output stage (FIGS. 11 and 12).

However, in this embodiment, the flip-flop multivibrator furthermore incorporates asynchronous means of initialization and of resetting to an initial state of the data storage nodes. Furthermore, the output stage provides for a duplication of the outputs in such a way as to deliver two inverted output data. Additionally, this multivibrator proposes a circuit for formulating a particular clock signal making it possible to disable the writing of data to the storage nodes when the initialization and reset to initial state control signals are active. Finally, a multiplexing stage (FIG. 13) allows selective writing to the data storage nodes either of the first data, or of the second data, for example of the test data.

As will be described in detail hereinbelow, the presence of the multiplexing circuit is advantageous when a chip of integrated circuits comprises a set of multivibrators implanted in the form of a chain of multivibrators placed in series in so far as, in this case, it is possible to write, to the multivibrators, test words emanating from external logic circuits and to recover as output from the chain of multivibrators the words successively written and then transferred from one multivibrator to the other with a view to analysing appropriate operation of the multivibrators.

Figure 7:
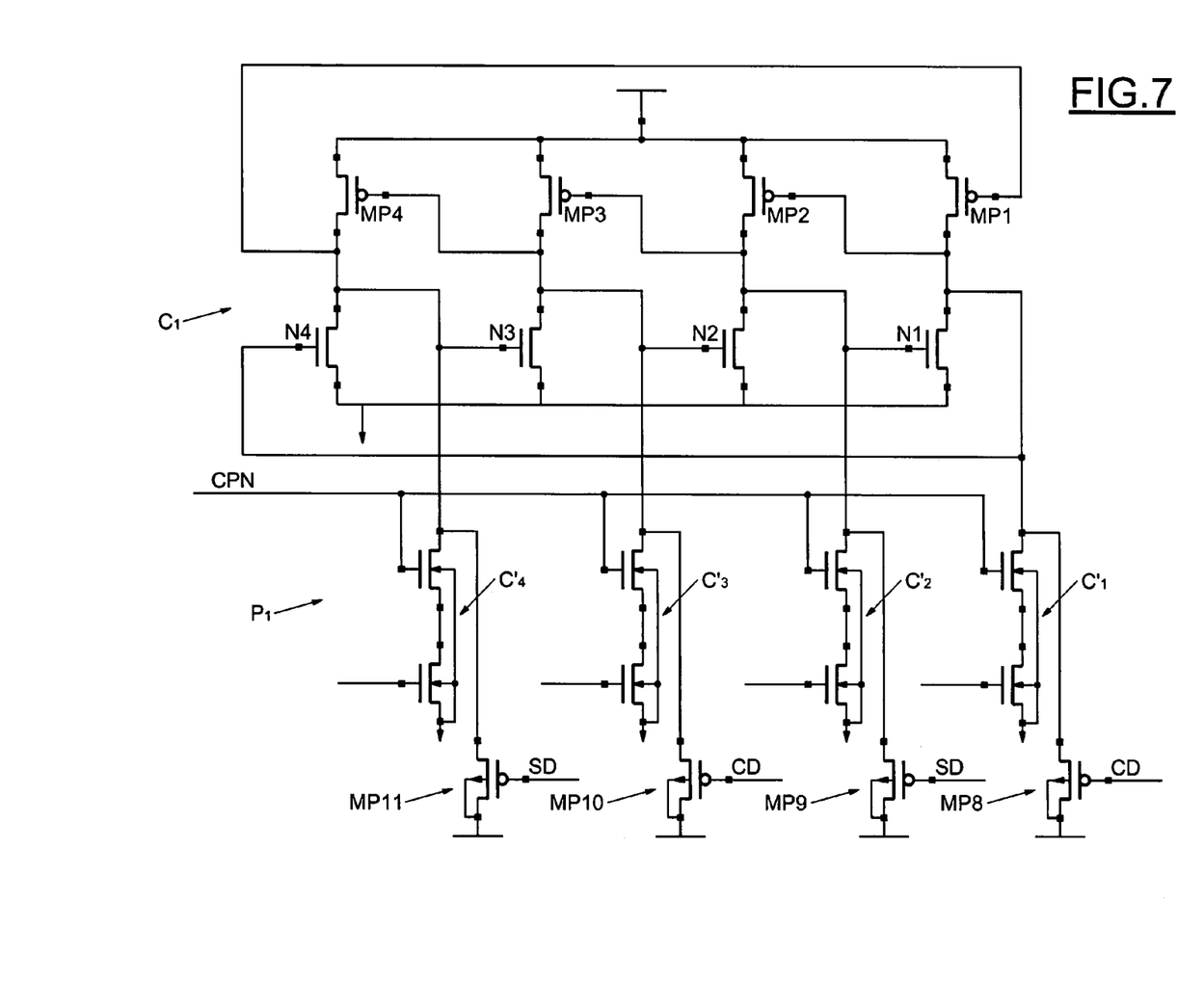
FIGS. 7 and 8 are schematic diagrams respectively illustrating another exemplary embodiment of the first latch cell and of the second latch cell.
Figure 8:
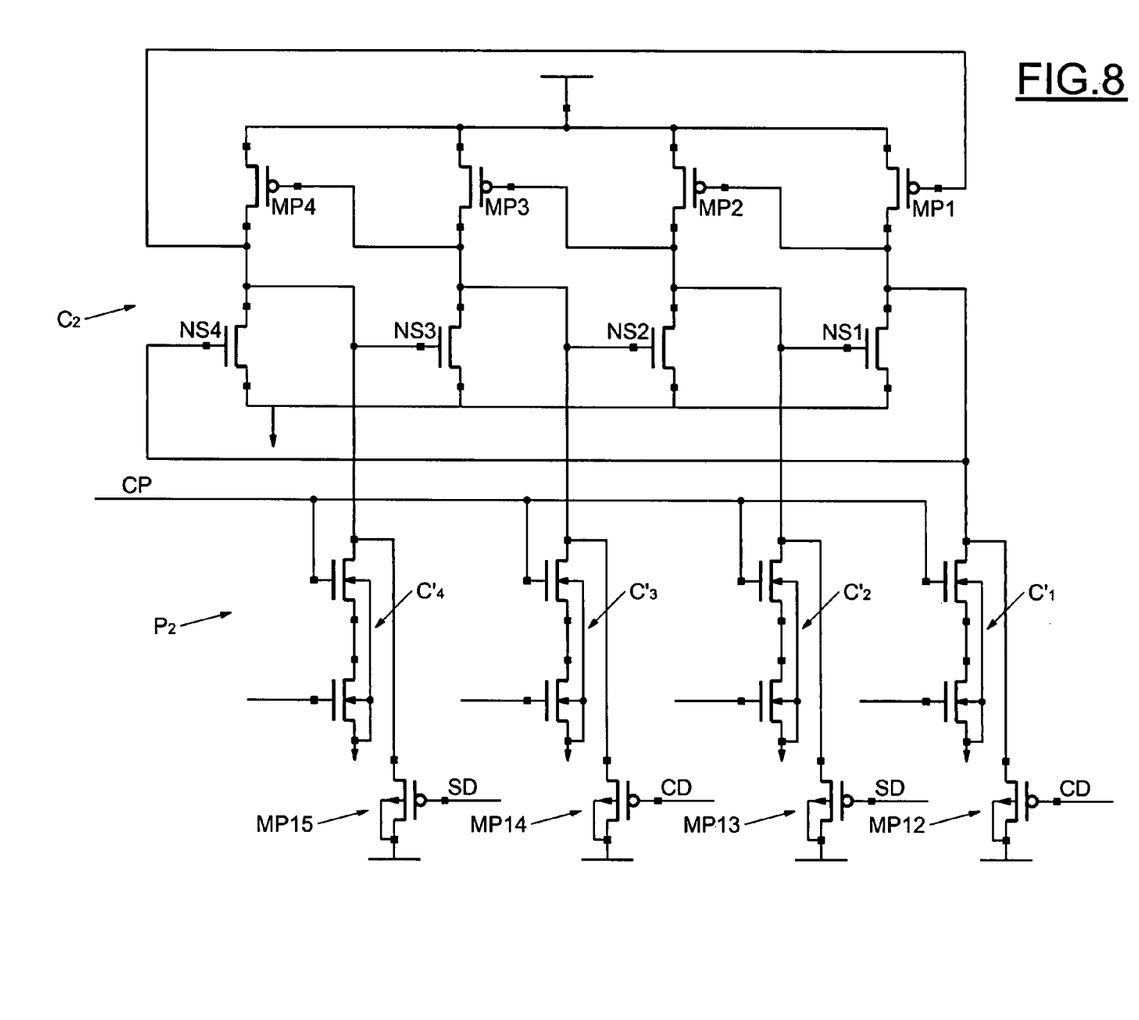

As may be seen in FIGS. 7 and 8, the master storage cell $C_1$ and the slave storage cell $C_2$, as well as the transfer ports $P_1$ and $P_2$ associated with them have a structure identical to that of the latch cells described previously with reference to FIGS. 2 and 3. Their structure will therefore not be described further hereinbelow. It will however be noted that, as indicated previously, these latch cells $C_1$ and $C_2$ are associated with means of initialization and/or of resetting to an initial state.

As may be seen in these FIGS. 7 and 8, for this purpose, each data storage node N1, N2, N3, N4 and NS1, NS2, NS3 and NS4 is associated with a circuit for initialization/resetting to the initial state embodied in the form of a MOS transistor of P type, namely the transistors designated by the references MP8 to MP15 whose source is connected to a DC supply voltage, whose drain is connected between the write circuits $C'_1$, $C'_2$, $C'_3$ and $C'_4$ and the data storage nodes, and whose gate receives an initialization control signal SD or a reset to the initial state control signal CD.

For example, the initialization control signal SD is applied to the gate of the transistors that are associated with the data storage node pairs in which a data item is stored, while the reset to the initial state control signal CD is applied to the gate of the MOS transistors that are associated with the pairs of data storage nodes in which an inverted data item is stored. When SD=0 then Q=1. On the other hand, when CD=0, then Q=0.

Figure 9:
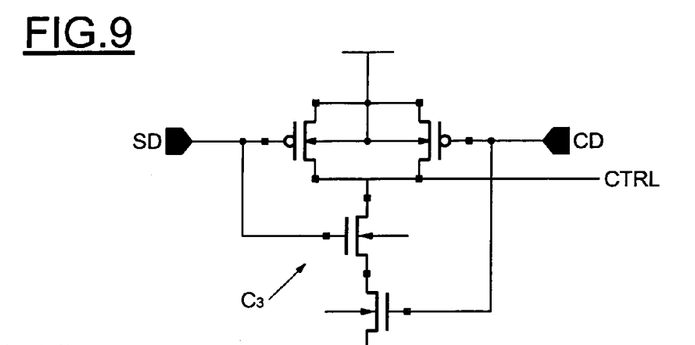
FIG. 9 is a schematic diagram illustrating the formulation of initialization control signals and of reset to the initial state control signals intended for the first and second latch cells of FIGS. 7 and 8.

Referring to FIG. 9, the initialization control signal SD and the reset to the initial state control signal CD are used to formulate a supervision signal CTRL intended to formulate the clock signals CP and CPN for the master and slave cells as a function of the state of the signals SD and CD. The clock circuit serving for the formulation of the clock signals CP and CPN is in fact furnished with a supervision stage C3 which carries out a NAND function between the signal SD and the signal CD so as to formulate the supervision signal CTRL. Such a function is carried out on the basis of MOS transistors of P type and of N type in a manner known per se.

Figure 10:
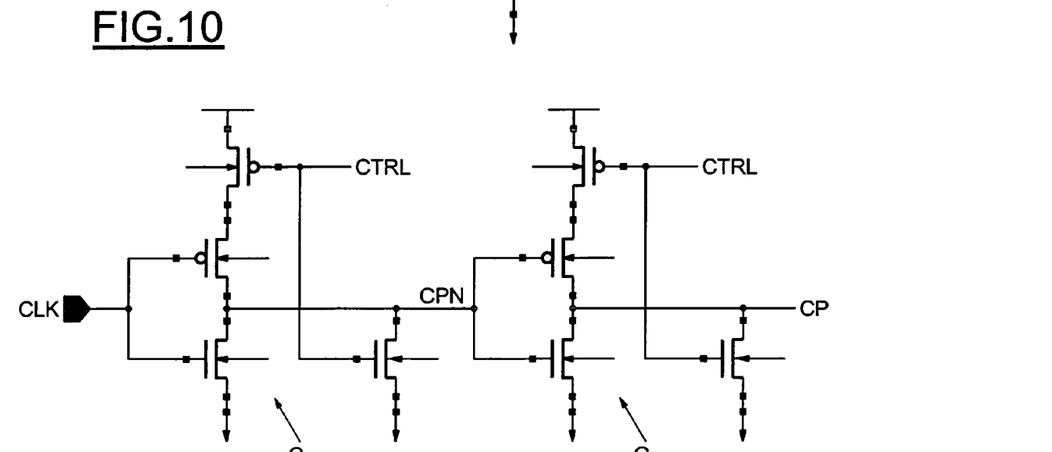
FIG. 10 is a schematic diagram illustrating a circuit for formulating clock signals intended to regulate the first and second latch cells, as a function of the state of the initialization and reset to the initial state control signals.

Referring now to FIG. 10, the supervision signal CTRL is used to disable or enable the clock signals CPN and CP delivered to the master and slave latch cells as a function of the level of the control signals SD and CD so that the writing of data to the data storage nodes is prohibited during the phases of initialization or of resetting to the initial state.

As may be seen in FIG. 10, the clock signals CPN and CP are formulated from a base clock signal CLK and from the supervision signal CTRL. A first circuit C4 performs a NOR function between the clock signal CLK and the supervision signal CTRL so as to formulate the clock signal CPN delivered to the master latch cell $C_1$. A second circuit C5 carries out a NOR logic function between the clock signal CPN and the supervision signal CTRL so as to formulate the clock signal CP provided to the slave latch cell $C_2$. These NOR logic ports formed by the circuits C4 and C5 are embodied from MOS transistors of N and P type, in a known manner.

Referring now to FIGS. 11 and 12, the flip-flop multivibrator comprises two output circuits delivering two duplicate inverted outputs Q and $\overline{Q}$. These circuits are identical to the output circuit described previously with reference to FIG. 5 and thus each constitute an output stage protected against current or voltage spikes. In these figures, elements identical to those of FIG. 5 are designated by the same references. It will be noted that each output stage C5 or C6 comprises a transfer stage providing for the transfer of data in the high state and a transfer state providing for the transfer of data in the low state. For example, each stage for transferring data in the high state consists of the association of two MOS transistors of P type whereas each stage for transferring data in the low state comprises two MOS transistors of N type.

As far as the stage for transferring data in the high state of the circuits C5 and C6 is concerned, the source of a first transistor of P type MP6 is connected to a DC voltage source while its drain is connected to the source of a second transistor of P type MP7 whose drain delivers an output data item Q or $\overline{Q}$. Likewise, as far as the stage for transferring data in the low state is concerned, the drain of a first MOS transistor of N type MN6 is connected to the drain of the second MOS transistor of P type of the stage for transferring data in the high state, while the source of this first MOS transistor of N type is connected to the drain of a second transistor of N type MN7 whose source is connected to earth.

As in the exemplary embodiment described previously with reference to FIG. 5, the redundant data LB and L1B tapped off from the nodes NS2 and NS4 are provided to the first output stage and are respectively presented, on the one hand, on the gate of the second MOS transistor of P type MP7 and of the first MOS transistor of N type MN6 and, on the other hand, on the gate of the first MOS transistor of P type MP6 and on the gate of the second MOS transistor of the N type MN7. This first output stage C5 thus delivers an output data item Q.

As far as the second output stage C6 is concerned, the data L and L1 tapped off from the nodes NS3 and NS1 are respectively presented, on the one hand, on the gate of the first MOS transistor of P type and of the second MOS transistor of N type and, on the other hand, on the gate of the second MOS transistor of P type and of the first MOS transistor of N type. This second output stage thus provides, as output, the inverted output data item $\overline{Q}$.

Figure 13:
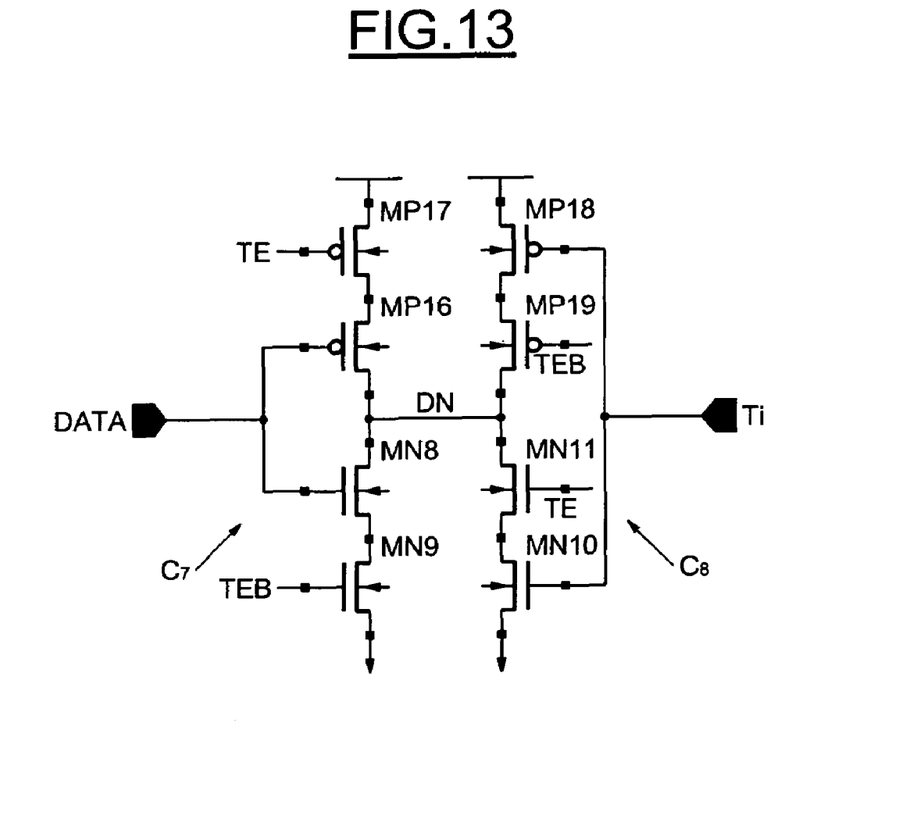
FIG. 13 is a schematic diagram illustrating an exemplary embodiment of a circuit for multiplexing the inputs of the first latch cell of FIG. 7.

Referring finally to FIG. 13, the multivibrator furthermore comprises a multiplexing circuit providing for a multiplexing between a first input data item DATA and a second input data item T1 so as to formulate the data DN actually presented as input to the master latch cell $C_1$ by way of the first data transfer port. As indicated previously, according to a particularly beneficial application, the input data DATA are intended to constitute the data used during normal operation of the multivibrator, whereas the input data T1 are intended to constitute multivibrator test data delivered to the multivibrator during a test phase.

The multiplexing circuit comprises two input circuits C7 and C8 receiving the one, namely the input circuit C7, the input data item DATA and the other, namely the input circuit C8, the test data item T1. As may be seen in FIG. 13, the input circuits C7 and C8 have a similar structure. They in fact each comprise a MOS transistor of P type providing for the transfer of data in the low state and a transistor of N type providing for the transfer of data in the high state under the supervision of a transistor P and of a transistor N, respectively.

In fact, as far as the first input circuit is concerned, the latter comprises a MOS transistor of P type MP16 and a MOS transistor of N type MN8. The gate of each of these transistors receives the input data item DATA. The source of the transistor MP16 is connected to the drain of an access transistor MP17 whose source is connected to a constant supply voltage and whose gate receives a test control signal TE. Likewise, the gate of the transistor MN8 receives the input data item DATA. Its drain is connected to the drain of the transistor MP16 and delivers the input data item DN for the master latch cell $C_1$ and its source is connected to the drain of an access transistor of N type MN9 whose gate receives an inverted test control signal TEB and whose source is connected to ground.

The second input circuit also comprises, on the one hand, a MOS transistor of P type MP18 whose gate receives the test data TI and whose source is connected to a DC supply voltage. This transistor MP18 is driven by an access transistor of P type MP19 whose source is connected to the drain of the transistor MP18, whose drain provides the input data item DN and whose gate receives the inverted test control signal TEB.

The test data TI are also provided to the gate of a transistor of N type MN10 whose source is connected to earth and whose drain is connected to the source of an access transistor MN11. The drain of this transistor MN11 is connected to the drain of the transistor MP19 and its gate receives the test control signal TE. Accordingly, the data DN presented as input to the master latch cell $C_1$ correspond either to the input data DATA or to the test data TI. In particular, according to the layout represented in FIG. 13, when the test control signal TE is set to 1, the test data TI constitute the input data DN. Conversely, when the test control signal TE is zero, the input data DATA are transmitted to the multivibrator.

Figure 14:
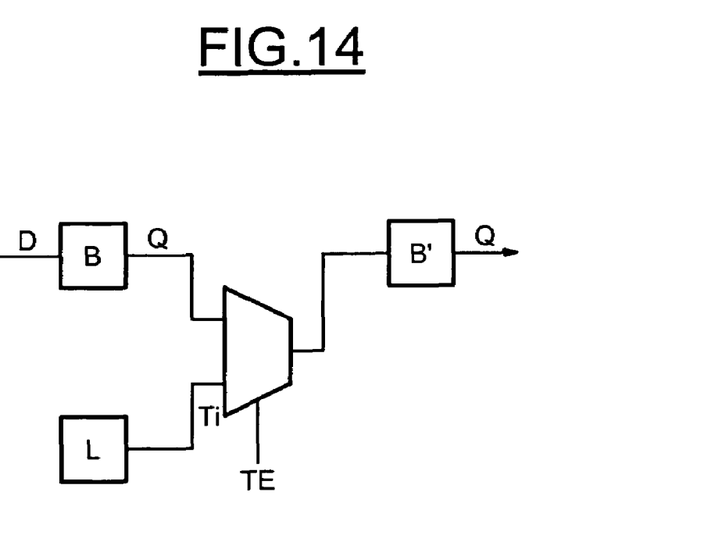
FIG. 14 is a block diagram illustrating a mode of use of multivibrators according to the invention in the form of a chain of flip-flop multivibrators placed in series.

Referring finally to FIG. 14, the use of such a multiplexer MUX is especially advantageous when flip-flop multivibrators are implanted in the form of a chain of multivibrators in series, such as B and B', in a chip of integrated circuits. In this case, it is possible to undertake phases of testing of the multivibrators by using test data TI formulated on the basis of a logic circuit L. By setting the test control signal TE to 1, the test data TI are written to the multivibrators. At each active edge of the clock signal, these two test data are transferred to the output of the chain of multivibrators so as to be subsequently analyzed to verify appropriate operation of the multivibrators.

It will be noted finally that the invention is not limited to the embodiments described. Specifically, in an embodiment described with reference to FIGS. 7 and 8, the master and slave latch cells $C_1$ and $C_2$ are each associated with means of initialization and of resetting to the initial state making it possible, as described previously to force the data stored in the storage nodes to a predetermined level or to reset them to an initial state. In particular, the signals SD or CD make it possible to force the output of the multivibrator to a corresponding voltage level.

However, when a low voltage level is applied to the input SD or CD of the constituent transistors of the means of initialization/resetting to the initial state MP8 to MP15, a high level is imposed on the corresponding data storage nodes, and in particular, on the NMOS transistors MN1, MN2, MN3 or MN4 opposite. Thus, with reference to FIG. 7, for example, the initialization control signal SD, which acts on the MOS transistors of P type MP9 and MP11 imposes a voltage level in the nodes N4 and N2.

Likewise, as far as the reset to the initial state command CD is concerned, the MOS transistors of P type MP8 and MP10 impose a voltage level on the data storage nodes referenced N1 and N3. This is achieved during the phase of initialization or of resetting to the initial state and consists in placing in conflict the PMOS transistors of the circuit for initialization/resetting to the initial state and the NMOS transistors associated with the data storage nodes. It may therefore be necessary to adjust the relative strength of the MOS transistors in conflict, that is to say the amount of current that they allow to pass. This entails in particular overdimensioning the initialization/reset to the initial state control transistor with respect to that of the storage nodes.

Figure 15:
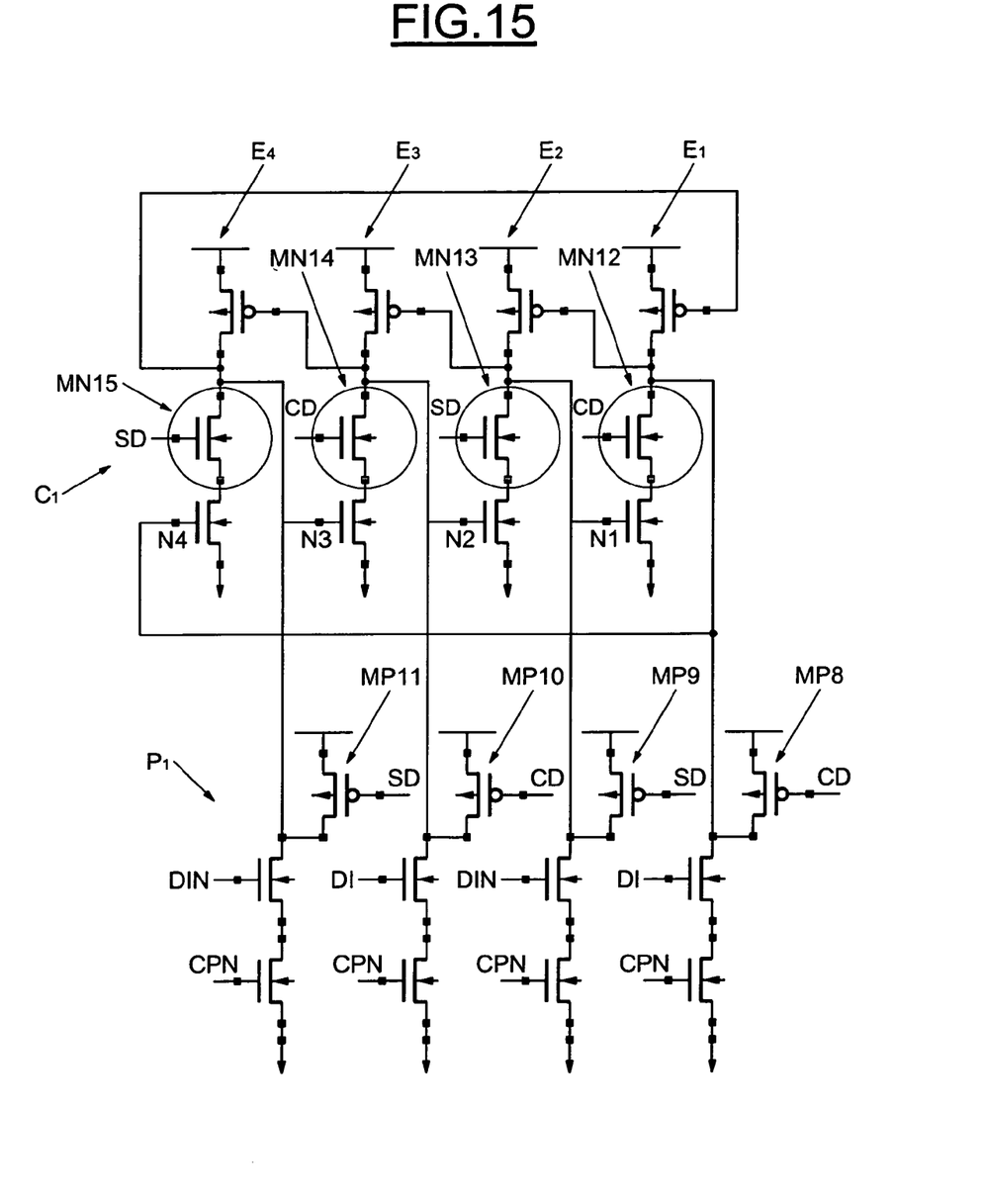
FIG. 15 is a schematic diagram illustrating yet another embodiment of the latch cells according to the invention.

With the aim of alleviating the drawbacks related to the conflict between the transistors of the initialization/reset to the initial state circuit, on the one hand, and the transistors associated with the data storage nodes, on the other hand, in an embodiment, illustrated in FIG. 15, there is disposed in series with the transistors MN1, MN2, MN3 and MN4 a MOS transistor of N type MN12, MN13, MN14 and MN15 whose source is connected to the drain of a corresponding transistor MN1, MN2, MN3 or MN4, whose drain is linked to the drain of the MOS transistor of P type MP1, MP2, MP3 or MP4 of the sets of transistors $E_1$, $E_2$, $E_3$ and $E_4$, and whose gate receives an initialization or reset to the initial state control signal SD or CD. Thus, when the signal SD or CD is active, this cutoff transistor is not turned on, thus isolating the transistor associated with the data storage nodes. Also, by virtue of this embodiment, it is no longer necessary to establish a balance of strength between the transistors of the initialization/reset to the initial state circuit and the transistor associated with the data storage nodes.

The invention claimed is:

1. A multivibrator circuit protected against at least one of current and voltage spikes, comprising:
    a first data transfer port that receives multivibrator input data;
    a master latch cell connected to an output of the first transfer port;
    a slave latch cell; and
    a second data transfer port between the master and slave latch cells;
    each of the master and slave latch cells comprising a plurality of redundant data storage nodes;
    the first and second data transfer ports each comprising a writing circuit to write data separately into each redundant data storage node.

2. The multivibrator circuit according to claim 1, wherein each latch cell comprises four redundant data storage nodes, and the writing circuit of each of the transfer ports comprises four separate write circuits for writing the data into the four redundant data storage nodes respectively.

3. The multivibrator circuit according to claim 2, wherein each write circuit comprises first and second N-type MOS transistors connected together via the drain of the first N-type MOS transistor and the source of the second type MOS transistor; the gate of the first N-type MOS transistor of each write circuit of the master latch cell receives input data; the gate of the second N-type MOS transistor of each write circuit of the slave latch cell receives data from a respective data storage node of the master latch cell; the gate of the second N-type MOS transistors receives a clock signal; and the drain of the second N-type MOS transistors of each write circuit writes data into a respective storage node of the corresponding latch cell.

4. The multivibrator circuit according to claim 2, wherein the second stage comprises:
   a first P-type MOS transistor having a gate that receives data in a low state, and a source receiving a power supply; and
   a second P-type MOS transistor having a source connected to the drain of the first P-type MOS transistor, a gate that receives data in the low state, and a drain that provides data at an output of the multivibrator circuit.

5. The multivibrator circuit according to claim 4, wherein the first stage comprises:
   a first N-type MOS transistor having a gate that receives data in the high state, and a drain connected to the drain of the second P-type MOS transistor and provides data at the output of the multivibrator circuit; and
   a second MOS N-type transistor having a drain connected to the source of the first N-type MOS transistor, a gate that receives data in the high state, and a source connected to a reference voltage.

6. The multivibrator circuit according to claim 5, further comprising a second output circuit connected at the output of the slave data latch cell, protected against current and voltage spikes, and providing inverted output data.

7. The multivibrator circuit according to claim 6, wherein the second output circuit comprises a first stage for transferring data in the low state and comprising:
   a first P-type MOS transistor having a source receiving the power supply; and
   a second P-type MOS transistor having a source connected to the drain of the first P-type MOS transistor, and a drain that provides the inverted output data;
   the gate of the first and second P-type MOS transistors receiving redundant data defined by an inverse of the data provided on the gate of the first and second P-type MOS transistors of the first output circuit.

8. The multivibrator circuit according to claim 7, wherein the second output circuit comprises a second stage for transferring the data in the high state and comprising:
   a first N-type MOS transistor having a drain connected to the drain of the second P-type transistor of the second output circuit and that provides an inverted output data; and
   a second N-type MOS transistor having a drain connect to the source of the first N-type transistor, and a source connected to a reference voltage;
   the gate of the first and second N-type MOS transistors receiving redundant data defined by the inverse of the data presented on the gate of the first and second N-type MOS transistors of the first output circuit.

9. The multivibrator circuit according to claim 1, further comprising an input circuit to generate redundant data for the master latch cell.

10. The multivibrator circuit according to claim 9, wherein the input circuit comprises an inverter circuit for the inversion of input data to be written to data storage nodes.

11. The multivibrator circuit according to claim 1, further comprising an output circuit connected at an output of the slave data storage cell and protected against at least one of current and voltage spikes.

12. The multivibrator circuit according to claim 11, wherein the output circuit comprises a first stage for high state data transfer, and a second stage for the low state data transfer.

13. The multivibrator circuit according to claim 1, further comprising an asynchronous circuit for initialization and resetting of the data storage nodes to an initial state.

14. The multivibrator circuit according to claim 13, wherein the asynchronous circuit comprises a set of MOS transistors having gates receiving at least one of an initialization control signal and a reset-to-the-initial-state control signal, and sources and drains being connected to one of a predetermined potential and a corresponding data storage node to force the node to the potential based upon the control signals.

15. The multivibrator circuit according to claim 14, wherein the data storage nodes each comprise a transistor; and wherein the asynchronous circuit further comprises a set of MOS transistors in series with the transistors of the data storage nodes to inhibit an influence of the transistors when the initialization and/or reset to the initial state is active.

16. The multivibrator circuit according to claim 15, further comprising a clock circuit for delivering a clock signal and comprising a supervising stage delivering a supervising signal for disabling the clock signal based upon the asynchronous circuit.

17. The multivibrator circuit according to claim 16, wherein the clock circuit comprises:
   a first port providing a NAND function between the initialization control signal and the reset-to-the-initial-state control signal; and
   at least one port providing a NOR function between an output of the first port and the clock signal.

18. The multivibrator circuit according to claim 1, further comprising a multiplexing circuit for selectively providing the input data as a first or second input data item.

19. The multivibrator circuit according to claim 18, wherein the second data item comprises a testing data item for testing the multivibrator circuit from an external logic.

20. The multivibrator circuit according to claim 19, wherein the multiplexing circuit comprises a first input circuit receiving the input data and a second input circuit receiving the testing data item, each input circuit comprising two access transistors driven by test control signals, an N-type MOS transistor and a P-type MOS transistor for transferring the data in a high state and in a low state, respectively, based upon the two access transistors.

21. A method of protecting a multivibrator circuit against at least one of current and voltage spikes, the multivibrator circuit including a first data transfer port that receives multivibrator input data, a master latch cell connected to an output of the first transfer port, a slave latch cell, and a second data transfer port between the master and slave latch cells, the method comprising:
   providing each of the master and slave latch cells with a plurality of redundant data storage nodes; and
   providing each of the first and second data transfer ports with a writing circuit to write data separately into each redundant data storage node.

22. The method according to claim 21, wherein each latch cell comprises four redundant data storage nodes, and the writing circuit of each of the transfer ports comprises four separate write circuits for writing the data into the four redundant data storage nodes respectively.

23. The method according to claim 21, further comprising providing an input circuit to generate redundant data for the master latch cell.

24. The method according to claim 21, further comprising providing an asynchronous circuit for initialization and resetting of the data storage nodes to an initial state.

25. The method according to claim 21, further comprising selectively providing the input data as a first or second input data item via a multiplexing circuit.

26. The method according to claim 25, wherein the second data item comprises a testing data item for testing the multivibrator circuit.

27. A multivibrator circuit comprising:
- a plurality of multivibrators connected in series and each comprising
  - a first data transfer port that receives multivibrator input data,
  - a master latch cell connected to an output of the first transfer port,
  - a slave latch cell, and
  - a second data transfer port between the master and slave latch cells,
  - each of the master and slave latch cells comprising a plurality of redundant data storage nodes,
  - the first and second data transfer ports each comprising a writing circuit to write data separately into each redundant data storage node; and
- a multiplexing circuit interposed between two consecutive multivibrators to selectively write to the multivibrator at least one of a write data item during normal operation of the multivibrators, and a test word for the multivibrator during a test operation.

28. The muitivibrator circuit according to claim 27, wherein each latch cell comprises four redundant data storage nodes, and the writing circuit of each of the transfer ports comprises four separate write circuits for writing the data into the four redundant data storage nodes respectively.

* * * * *